(12) United States Patent
Clark et al.

(10) Patent No.: US 7,975,197 B2
(45) Date of Patent: Jul. 5, 2011

(54) ON-CHIP SCAN CLOCK GENERATOR FOR ASIC TESTING

(75) Inventors: Iain Clark, San Jose, CA (US); Juergen Dirks, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 1893 days.

(21) Appl. No.: 10/404,306

(22) Filed: Mar. 31, 2003

(65) Prior Publication Data

US 2004/0193981 A1 Sep. 30, 2004

(51) Int. Cl.
*G01R 31/28* (2006.01)

(52) U.S. Cl. ........................ 714/731; 714/729; 714/726

(58) Field of Classification Search ........................ None
See application file for complete search history.

(56) References Cited

U.S. PATENT DOCUMENTS

| | | | | |
|---|---|---|---|---|
| 5,911,063 | A * | 6/1999 | Allen et al. | 713/500 |
| 6,353,905 | B1 * | 3/2002 | Noguchi | 714/728 |
| 6,877,123 | B2 * | 4/2005 | Johnston et al. | 714/731 |
| 2002/0138801 | A1 * | 9/2002 | Wang et al. | 714/729 |
| 2003/0204802 | A1 * | 10/2003 | Sim | 714/726 |

OTHER PUBLICATIONS

Wikipedia Online Encyclopedia. Multiplexer. 2005. http://en.wikipedia.org/wiki/Multiplexer.*

* cited by examiner

*Primary Examiner* — Jeffrey A Gaffin
*Assistant Examiner* — Steve Nguyen
(74) *Attorney, Agent, or Firm* — Luedeka, Neely & Graham, P.C.

(57) ABSTRACT

A scan clock generator includes a clock signal input for receiving a clock signal, a scan shift mode signal input for receiving a scan shift mode signal, and a sequence controller coupled to the clock signal input for gating a selected number of clock signal pulses at a time to generate a sequence of nonconcurrent scan clock signals at separate outputs respectively in response to a first state of the scan shift mode signal.

16 Claims, 5 Drawing Sheets

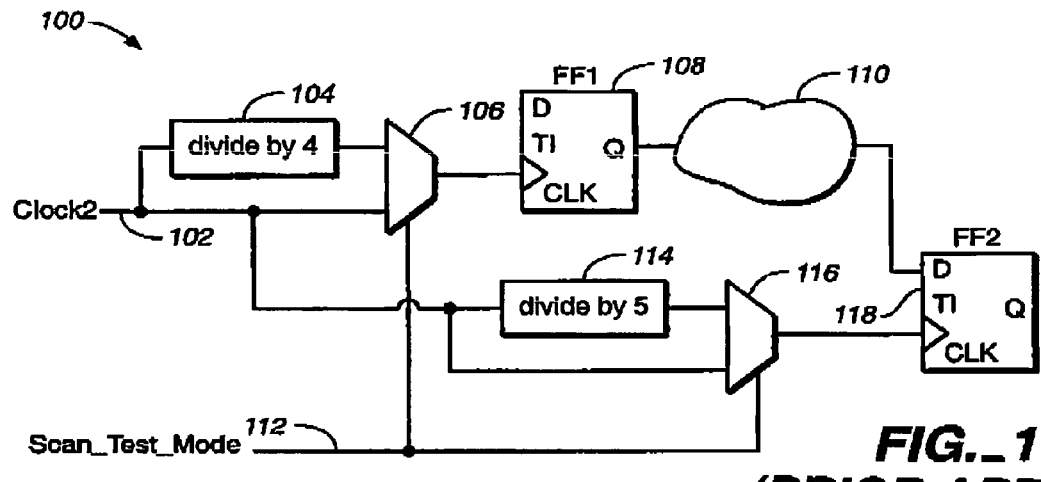
FIG._1
(PRIOR ART)
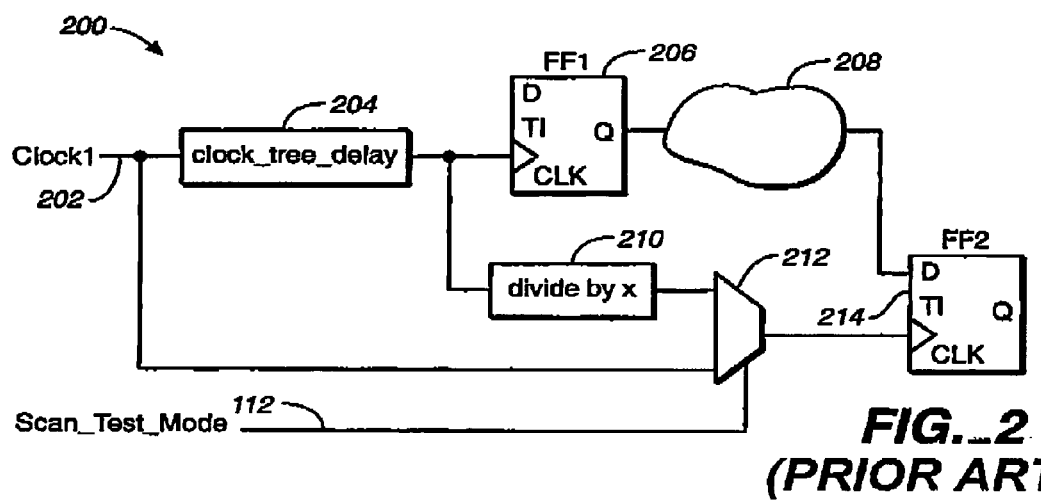
FIG._2
(PRIOR ART)

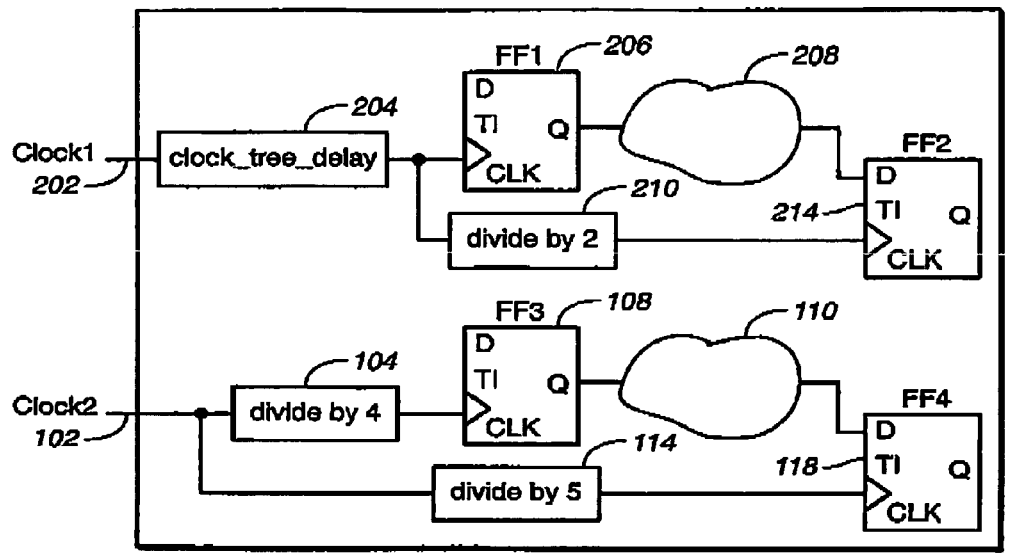
FIG._3 (PRIOR ART)
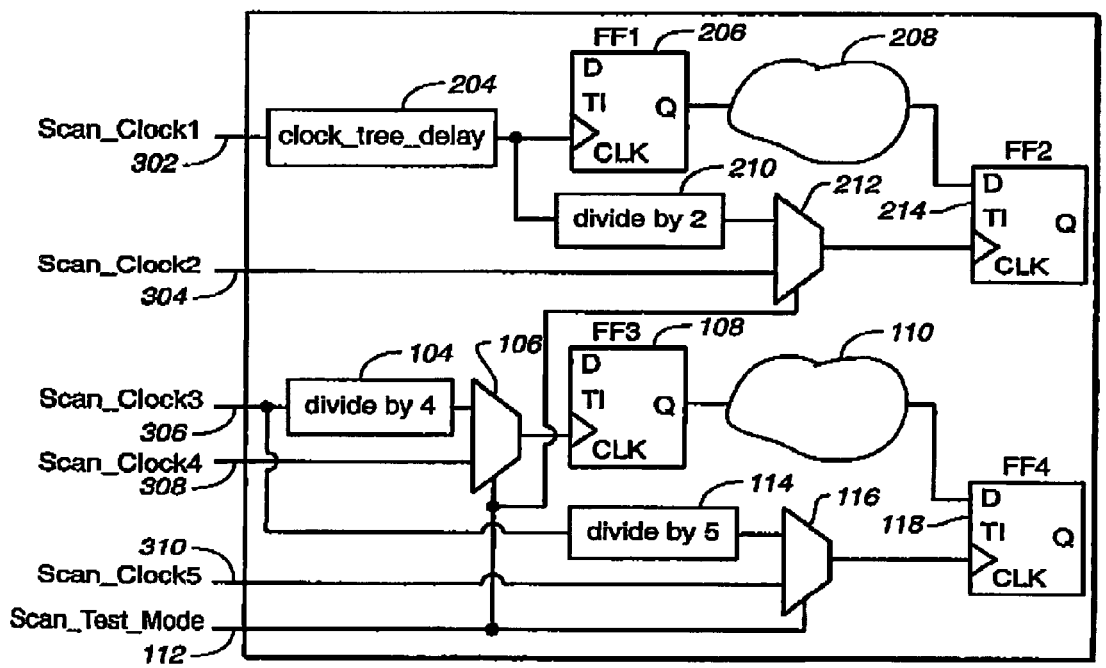
FIG._4

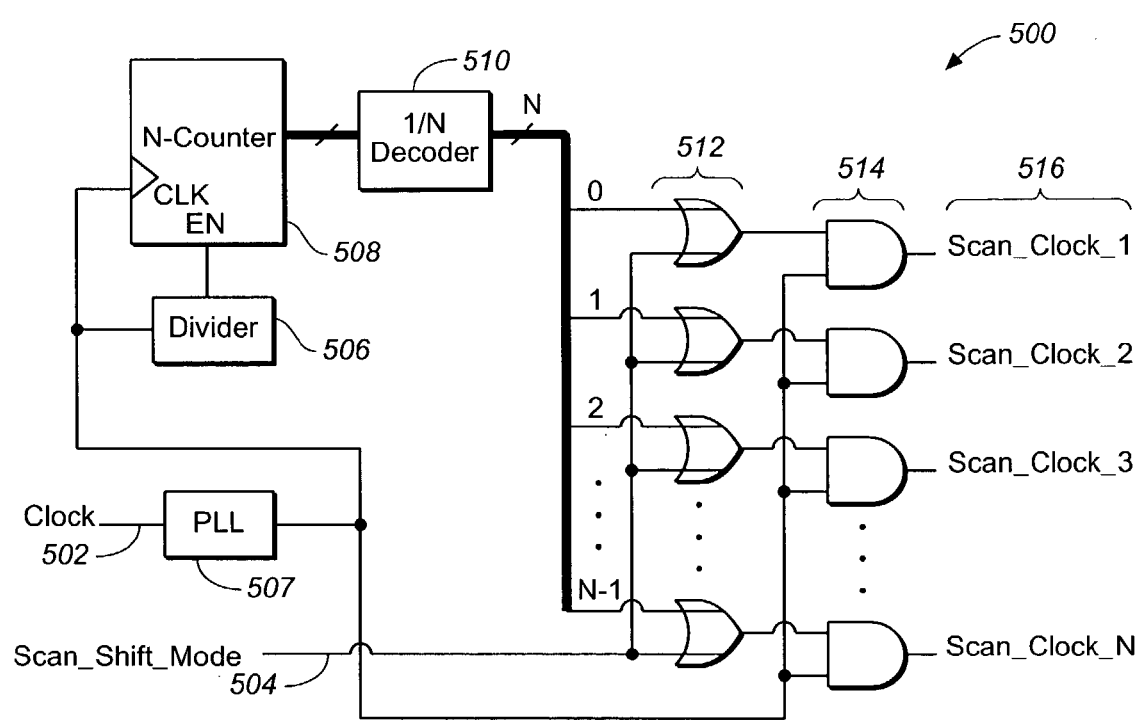
FIG._5

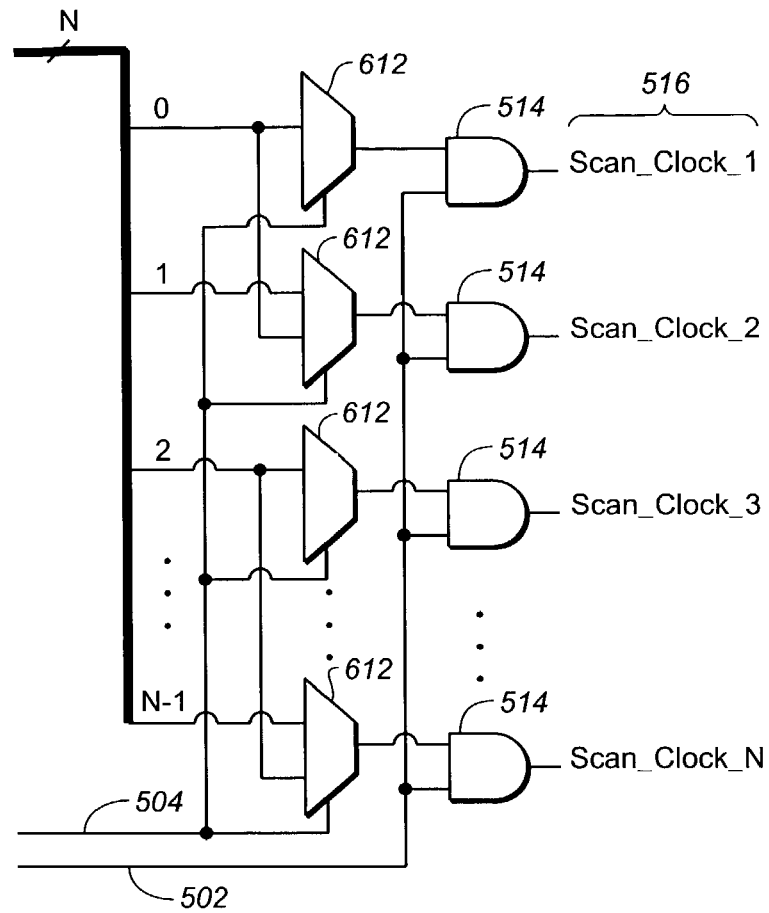
FIG._6
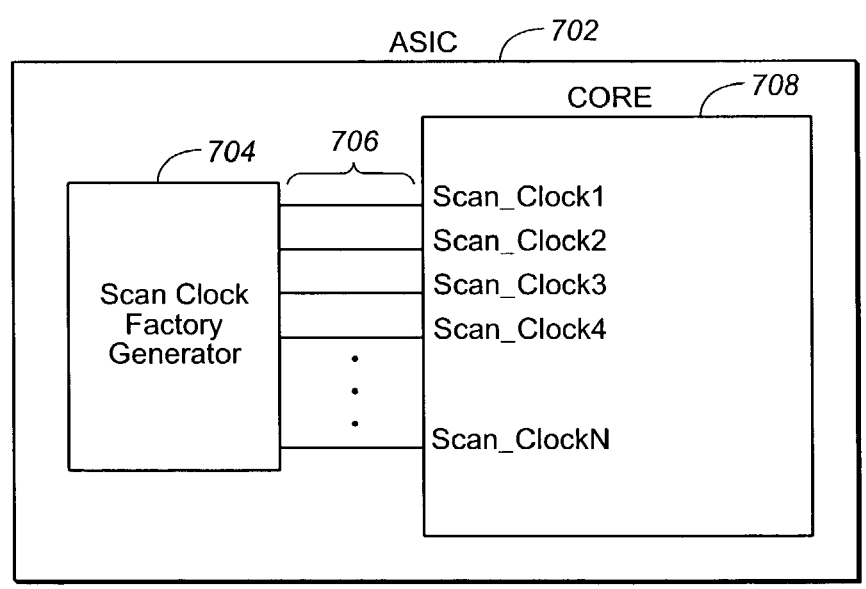
FIG._7

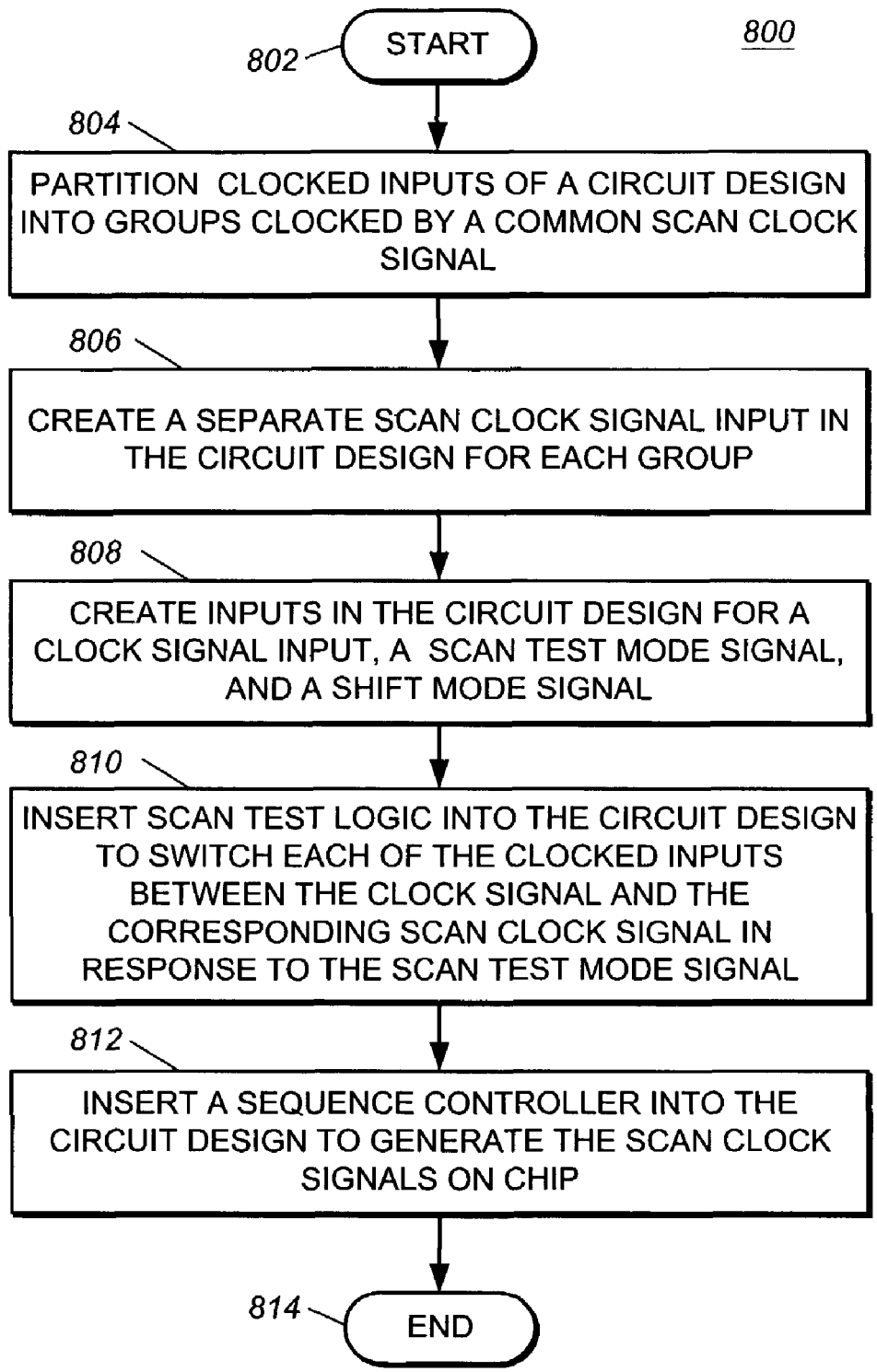
FIG._8

ON-CHIP SCAN CLOCK GENERATOR FOR ASIC TESTING

BACKGROUND OF THE INVENTION

1. Field of the Invention

The present invention is directed to testing application specific integrated circuit (ASIC) designs. More specifically, but without limitation thereto, the present invention is directed to an on-chip scan clock generator for generating multiple scan clock signals during testing of an ASIC design.

2. Description of the Prior Art

In testing application specific integrated circuit (ASIC) designs, complex clock structures used for the operating or functional mode of the ASIC must be simplified for scan test mode, for example, by multiplexing the functional mode clock signals with the scan clock signal so that the clock inputs of all flip flops in the ASIC may be accessed from the available input pins of the ASIC. The term "flip flop" is used herein to include all types of devices in an integrated circuit that have a clocked input, including but not limited to memory circuits. The scan clock signal may differ substantially from the functional mode clock signals at each flip flop, resulting in possible timing violations in the scan test mode which would not occur in the functional mode. These timing violations may be overlooked due to a lack of understanding of the differences between functional mode clocking versus scan clocking.

Previous approaches for avoiding some of the timing problems include arbitrary capture scan clocking at the cost of higher scan vector counts and either a corresponding increase in tester time or a lower fault coverage.

SUMMARY OF THE INVENTION

In one aspect of the present invention, a scan clock generator includes a clock signal input for receiving a clock signal, a scan shift mode signal input for receiving a scan shift mode signal, and a sequence controller coupled to the clock signal input for gating a selected number of clock signal pulses at a time to generate a sequence of nonconcurrent scan clock signals at separate outputs respectively in response to a first state of the scan shift mode signal.

In another aspect of the present invention, a method of generating multiple scan clock signals includes steps for:

(a) partitioning clocked inputs of a circuit design into groups wherein all the clocked inputs in each of the groups may be clocked by a corresponding scan clock signal for each of the groups that is separate from the scan clock signal for all other groups;

(b) creating a separate scan clock signal input in the circuit design for each of the groups so that the clocked inputs in each group may be clocked by the corresponding scan clock signal;

(c) creating inputs in the circuit design for a clock signal, a scan test mode signal, and a scan shift mode signal;

(d) inserting scan test logic for switching the clocked inputs in each of the groups between the clock signal and the corresponding scan clock signal in response to the scan test mode signal; and (e) inserting a sequence controller coupled to each separate scan clock signal input respectively for gating a selected number of clock signal pulses in the corresponding scan clock signal to generate a sequence of nonconcurrent scan clock signals in response to a first state of the scan shift mode signal.

DESCRIPTION OF THE ILLUSTRATED EMBODIMENTS

The present invention is illustrated by way of example and not limitation in the accompanying figures, in which like references indicate similar elements throughout the several views of the drawings, and in which:

FIG. 1 illustrates an example of a scan test circuit of the prior art that creates a new timing path;

FIG. 2 illustrates an example of a scan test circuit of the prior art that disregards clock tree insertion delay;

FIG. 3 illustrates the circuits of FIGS. 1 and 2 before inserting scan test logic;

FIG. 4 illustrates the circuit of FIG. 3 including scan test logic inserted according to an embodiment of the present invention;

FIG. 5 illustrates an example of a scan clock generator for the scan test logic of FIG. 4;

FIG. 6 illustrates an example of a circuit that may be included with the scan clock generator of FIG. 5 for testing chips that require low power consumption;

FIG. 7 illustrates the integration of a circuit and scan test logic with a scan clock generator on the same die according to an embodiment of the present invention; and FIG. 8 illustrates a flow chart for a method of generating multiple scan clock signals according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

During the development of a circuit, for example, an application specific integrated circuit (ASIC), test logic is typically inserted late in the design cycle, especially scan test logic. The implementation of clock signals in the circuit is generally designed to perform the function of the circuit and often does not account for circuit testing. As a result, the capability of test logic insertion tools to achieve high scan fault coverage is often limited by the clock implementation.

In addition to the limitations imposed by the clock implementation, the power consumption of the circuit may further limit the capability of test logic insertion tools to achieve high scan fault coverage. Specifically, a chip designed for low power consumption in the functional mode may exhibit extremely high power consumption in the scan test mode because a greater number of flip flops are switching during each clock cycle. The higher power consumption during testing may alter the behavior of the circuit or even result in damage to the circuit.

Test logic insertion tools are directed to determining how to partition flip flops in the circuit that are clocked by different clock sources into scan chains. Each scan chain is connected to an available input pin of the chip for connecting each flip flop in the scan chain to a scan clock signal. The number of scan clock signals that may be connected to the scan chains is limited by the number of available input pins. As a result, several scan chains are typically connected to the same chip input pin, which may reduce the achievable scan fault coverage. In some cases, functional chip pins may be used for scan clock signal inputs in the scan test mode, however, the achievable fault coverage may still be reduced as a result.

The clock structure in the scan test mode is accordingly very different from the clock structure in the functional mode of the design. Specifically, timing constraints are added to the scan test mode that are more stringent than the timing constraints in the functional mode. For example, functionally asynchronous clock domains become synchronous, resulting in false paths between clock domains becoming valid paths that have to operate at certain frequencies. Also, multicycle paths in the functional mode may become single cycle paths in the scan test mode and may have to operate at a higher speed.

FIG. 1 illustrates an example of a scan test circuit 100 of the prior art that creates a new timing path. Shown in FIG. 1 are a first clock signal 102, a first divider 104, a first multiplexer 106, a first flip flop 108, a first logic cloud 110, a scan test mode signal 112, a second divider 114, a second multiplexer 116, and a second flip flop 118.

In the functional mode, the clock signals for the first flip flop 108 and the second flip flop 118 have different frequencies according to the different divider ratios of the first divider 104 and the second divider 114. As a result, there is at least a multicycle path defined for the timing between the first flip flop 108 and the second flip flop 118, sometimes even a false path. When the scan test mode signal 112 is valid, the clock signals for the first flip flop 108 and the second flip flop 118 are identical, and the path between the first flip flop 108 and the second flip flop 118 has to meet timing in a single clock cycle. Also, the clock frequency to each of the first flip flop 108 and the second flip flop 118 is increased to that of the first clock signal 102 in the scan test mode.

Previous test logic insertion tools do not account for the insertion delay of clock trees. As a result, different branches of the same clock tree that may have different insertion delays are regarded as the same clock signal by the scan test logic insertion tool.

FIG. 2 illustrates an example of a scan test circuit 200 of the prior art that disregards a clock tree insertion delay. Shown in FIG. 2 are a scan test mode signal 112, a second clock signal 202, an insertion delay 204, a third flip flop 206, a second logic cloud 208, a third divider 210, a third multiplexer 212, and a fourth flip flop 214.

In the functional mode, the insertion delays of the second clock signal 202 to the clock inputs of the third flip flop 206 and the fourth flip flop 214 are nearly identical. When the scan test mode signal 112 is asserted, however, the insertion delay of the second clock signal 202 at the clock input of the fourth flip flop 214 is much less than that of the third flip flop 206. As a result, the hold time requirement is more difficult to meet in the scan test mode.

In one aspect of the present invention, a scan clock generator includes a clock signal input for receiving a clock signal, a scan shift mode signal input for receiving a scan shift mode signal, and a sequence controller coupled to the clock signal input for gating a selected number of clock signal pulses at a time to generate a sequence of nonconcurrent scan clock signals at separate outputs respectively in response to a first state of the scan shift mode signal.

FIG. 3 illustrates the circuits of FIGS. 1 and 2 before inserting scan test logic. Shown in FIG. 3 are a first clock signal 102, a first divider 104, a first flip flop 108, a first logic cloud 110, a second divider 114, a second flip flop 118, a second clock signal 202, an insertion delay 204, a third flip flop 206, a second logic cloud 208, a third divider 210, and a fourth flip flop 214.

The problems resulting from creating new timing paths in FIG. 1 and from disregarding clock tree insertion delay in FIG. 2 may be avoided by generating multiple scan clock signals as described below.

FIG. 4 illustrates the circuit of FIG. 3 including scan test logic inserted according to an embodiment of the present invention. Shown in FIG. 4 are a first divider 104, a first multiplexer 106, a first flip flop 108, a first logic cloud 110, a scan test mode signal 112, a second divider 114, a second multiplexer 116, a second flip flop 118, an insertion delay 204, a third flip flop 206, a second logic cloud 208, a third divider 210, a third multiplexer 212, a fourth flip flop 214, a first scan clock signal 302, a second scan clock signal 304, a third scan clock signal 306, a fourth scan clock signal 308, and a fifth scan clock signal 310.

The first scan clock signal 302 is identical to the first clock signal 202 in FIG. 3, and the third scan clock signal 306 is identical to the second clock signal 102 in FIG. 3, however, the first scan clock signal 302 and the third scan clock signal 306 may also be used as scan clock signals.

When the scan test signal 112 is valid, a separate scan clock signal is generated for each element that alters the clock signal. For example, in FIG. 4, the elements that alter the clock signal are the first divider 104, the second divider 114, and the third divider 210. The first multiplexer 106, the second multiplexer 116, and the third multiplexer 212 select the scan clock signals 308, 310 and 304 respectively in the scan test mode.

The test logic insertion is performed at the lowest or core level of the circuit design, in contrast to other logic insertion methods that insert test logic at the top design level. There need be no limitation on the number of available input pins, and the test logic insertion tool may define all identified independent clock groups for the scan test mode as new inputs to the core level as illustrated in FIG. 4. The multiple scan clock signals 302, 304, 306, 308 and 310 may be generated, for example, as described below.

FIG. 5 illustrates an example of a scan clock generator 500 that may be used for the scan test logic of FIG. 4. Shown in FIG. 5 are a clock signal 502, a scan shift mode signal 504, a toggle divider 506, a phase locked loop 507, a counter 508, a decoder 510, OR gates 512, AND gates 514, and multiple scan clocks 516. The counter 508 encodes an address corresponding to each of the multiple scan clocks 516 in response to each clock cycle received from the clock signal 502. The decoder 510 decodes the address from the counter 508 to enable one of the inputs of the corresponding OR gate 512.

When the scan shift mode signal 504 is low, each of the multiple scan clock signals 516 is enabled in sequence, so that none of the multiple scan clock signals 516 is concurrent with another. This function supports the scan capture mode. When the scan shift mode signal 504 is high, all the OR gates 512 are enabled, and all of the multiple scan clock signals 516 are concurrent with one another. This function supports the scan shift mode.

The toggle divider 506 may be included to disable the counter 508 for a selected number of clock cycles so that each of the multiple scan clocks generates the selected number of clock cycles instead of a single clock cycle.

In another embodiment of the present invention, the phase locked loop 507 may be included according to well-known techniques to change the frequency of the clock signal 502 to suit specific testing requirements or to shorten the test cycle time.

In a further embodiment, the sequential clocking scheme of the clock generator 500 may be used during the scan shift mode for chips designed for low power consumption.

Alternatively, a more intelligent state machine may be designed according to well-known techniques to provide more flexibility, for example, for arbitrary capture on a per scan frame basis.

FIG. 6 illustrates an example of logic that may be used with the scan clock generator 500 of FIG. 5 for testing chips that require low power consumption. Shown in FIG. 6 are a clock signal 502, a scan shift mode signal 504, multiplexers 612, AND gates 514, and multiple scan clocks 516. When the scan shift mode signal 504 is low, each of the multiple scan clock signals 516 is enabled in sequence as in the example of the scan clock generator 500 in FIG. 5, so that none of the multiple scan clock signals 516 is concurrent with another. When the scan shift mode signal 504 is high, however, the multiplexers enable more than one but fewer than all of the AND gates 512 in sequence concurrently. The number of the multiple scan clock signals 516 operating concurrently may accordingly be selected to maintain low power consumption while requiring less testing time than toggling each scan clock separately.

FIG. 7 illustrates the integration of a circuit and scan test logic with a scan clock generator on the same die according to an embodiment of the present invention. Shown in FIG. 7 are a die of an application specific integrated circuit (ASIC) 702, a scan clock generator 704, multiple scan clocks 706, and an ASIC core 708.

The ASIC core 708 may be designed to include scan test logic as described above, and a floor plan for a die 702 of an application specific integrated circuit (ASIC) may be performed according to well-known techniques. The scan clock generator 704 may be designed as described above and included in the floor plan so that the scan clock generator 704 and the ASIC core 708 including the scan test logic are integrated on the same die 702. Because the multiple scan clocks 706 are generated on-chip, no additional input pins must be used to connect scan clock signals to the scan test logic.

In another aspect of the present invention, a method of generating multiple scan clock signals includes steps for:

(a) partitioning clocked inputs of a circuit design into groups wherein all the clocked inputs in each of the groups may be clocked by a corresponding scan clock signal for each of the groups that is separate from the scan clock signal for all other groups;

(b) creating a separate scan clock signal input in the circuit design for each of the groups so that the clocked inputs in each group may be clocked by the corresponding scan clock signal;

(c) creating inputs in the circuit design for a clock signal, a scan test mode signal, and a scan shift mode signal;

(d) inserting scan test logic for switching the clocked inputs in each of the groups between the clock signal and the corresponding scan clock signal in response to the scan test mode signal; and (e) inserting a sequence controller coupled to each separate scan clock signal input respectively for gating a selected number of clock signal pulses in the corresponding scan clock signal to generate a sequence of nonconcurrent scan clock signals in response to a first state of the scan shift mode signal.

FIG. 8 illustrates a flow chart for a method of generating multiple scan clock signals according to an embodiment of the present invention.

Step 802 is the entry point of the flow chart 400.

In step 804, the clocked inputs of a circuit design are partitioned into groups in which all the clocked inputs of a group may be clocked by a common scan clock signal for the group. The groups are selected to avoid creating new timing paths and to take clock tree insertion delays into account as described above.

In step 806, a separate scan clock signal input is created in the circuit design for each of the groups. Each of the groups has a separate corresponding scan clock signal that is common to all of the clocked inputs within the group.

In step 808, inputs are created in the circuit design for a clock signal, a scan test mode signal, and a scan shift mode signal. The clock signal may be, for example, the clock signal used in the functional mode of the circuit design. The scan test mode signal is generated during a scan test of the circuit according to well-known techniques.

In step 810, scan test logic is inserted into the circuit design to switch each of the clocked inputs between the clock signal and the corresponding scan clock signal in response to the scan test mode signal.

In step 812, a sequence controller is inserted into the circuit design so that the scan clock signals may be generated on the same die as the circuit in response to the clock signal, the scan test mode signal, and the scan shift mode signal. Each of the scan clock signals is enabled sequentially in response to a scan shift mode signal so that the scan clock signal in each of the groups is enabled separately from the scan clock signal for each of the other groups in the scan capture mode; that is, the scan clock signal for one group is not concurrent with the scan signal of any other group in response to a first state of the scan shift mode signal. In a second state of the scan shift signal, the scan clock signal for one of the groups is concurrent with the scan clock signal for at least one of the other groups. If low power consumption is not required, all of the scan clock signals may be concurrent with one another in the second state of the scan shift mode signal.

Step 814 is the exit point of the flow chart 800.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A scan clock generator comprising:
   only one clock signal input for receiving only one input clock signal;
   a scan shift mode signal input for receiving a scan shift mode signal;
   scan clock signal outputs for generating consecutive scan clock pulses all from only the input clock signal; and
   a sequence controller coupled to the clock signal input for gating a first two consecutive scan clock pulses only to a first one of the scan clock signal outputs and gating a second two consecutive scan clock pulses only to a second one of the scan clock signal outputs in response to a first state of the scan shift mode signal.

2. The scan clock generator of claim 1 further comprising logic for gating at least one of the consecutive scan clock pulses to at least two of the scan clock signal outputs concurrently while gating none of the consecutive scan clock pulses to another one of the scan clock signal outputs in response to a second state of the scan shift mode signal.

3. The scan clock generator of claim 1 wherein the sequence controller comprises:
   a counter for generating a count in response to the input clock signal; and
   a decoder coupled to the counter for selecting one of the scan clock signal outputs in response to the count.

4. The scan clock generator of claim 3 wherein the decoder selects at least two of the scan clock signal outputs in response to a second state of the scan shift mode signal.

5. The scan clock generator of claim 1 further comprising a frequency multiplier coupled to the clock signal input for increasing a frequency of the scan clock pulses.

6. The scan clock generator of claim 1 wherein the sequence controller comprises a state machine for arbitrary capture on a per scan frame basis.

7. A scan clock generator comprising:
- a partition of clocked inputs of a circuit design into groups;
- scan clock signal inputs for receiving a separate scan clock signal for each of the groups;
- only one clock signal input for receiving only one input clock signal;
- a scan test mode signal input for receiving a scan test mode signal;
- a scan shift mode signal input for receiving a scan shift mode signal;
- scan test logic for generating consecutive scan clock pulses all from only the input clock signal; and
- a sequence controller for gating a first two consecutive scan clock pulses only to a first one of the scan clock signal inputs and gating a second two consecutive scan clock pulses only to a second one of the scan clock signal inputs in response to a first state of the scan shift mode signal.

8. A method of generating multiple scan clock signals comprising steps of:
- (a) partitioning clocked inputs of a circuit design into groups;
- (b) creating scan clock signal inputs in the circuit design for receiving a separate scan clock signal for each of the groups;
- (c) creating only one clock signal input in the circuit design for receiving only one input clock signal, an input for receiving a scan test mode signal, and an input for receiving a scan shift mode signal;
- (d) inserting scan test logic in the circuit design for generating consecutive scan clock pulses from only the input clock signal; and
- (e) inserting a sequence controller in the circuit design for gating a first two consecutive scan clock pulses only to a first one of the scan clock signal inputs and gating a second two consecutive scan clock pulses only to a second one of the scan clock signal inputs in response to a first state of the scan shift mode signal.

9. The method of claim 8 wherein the groups are selected to avoid creating new timing paths.

10. The method of claim 8 wherein the groups are selected to account for clock tree insertion delays.

11. The method of claim 8 further comprising a step of gating the consecutive scan clock pulses to at least two of the scan clock signal inputs concurrently in response to a second state of the scan shift mode signal.

12. The method of claim 8 further comprising a step of integrating the circuit design, the scan test logic, and the sequence controller on the same die.

13. The method of claim 8 further comprising steps of:
- (f) generating a count in response to the input clock signal; and
- (g) gating the consecutive scan clock pulses to one of the scan clock signal inputs in response to the count.

14. The method of claim 13 wherein step (g) comprises gating at least one of the consecutive clock signal pulses to at least two of the scan clock signal inputs concurrently while gating none of the consecutive clock signal pulses to another one of the scan clock signal inputs in response to a second state of the scan shift mode signal.

15. The method of claim 8 further comprising a step of multiplying the input clock signal to increase a frequency of the scan clock pulses.

16. The method of claim 8 wherein step (e) comprises arbitrary capture on a per scan frame basis.

\* \* \* \* \*